(12) United States Patent
Curtis et al.

(10) Patent No.: US 6,388,779 B1
(45) Date of Patent: May 14, 2002

(54) PROCESS FOR HOLOGRAPHY INVOLVING TILT COMPENSATION

(75) Inventors: Kevin Richard Curtis, New Providence; Michael C Tackitt, Califon, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/553,512

(22) Filed: Apr. 20, 2000

(51) Int. Cl.$^7$ .............................. G03H 1/16; G03H 1/28; G11C 13/04
(52) U.S. Cl. .............................. 359/22; 359/24; 359/12; 365/125
(58) Field of Search .............................. 359/22, 24, 25, 359/3, 29, 629, 11, 561; 365/125, 189.02, 235

(56) References Cited

U.S. PATENT DOCUMENTS

| | | | |
|---|---|---|---|
| 2,896,499 A | * 7/1959 | De Lang | 359/629 |
| 3,697,149 A | 10/1972 | Heeckeren et al. | |
| 3,794,407 A | * 2/1974 | Nishimura | 359/634 |
| 3,911,729 A | * 10/1975 | Collins | 359/901 |
| 3,940,204 A | * 2/1976 | Withrington | 359/19 |
| 5,200,857 A | * 4/1993 | Matsushita | 359/634 |
| 5,490,013 A | * 2/1996 | Shimizu et al. | 359/637 |
| 5,719,691 A | 2/1998 | Curtis et al. | |

FOREIGN PATENT DOCUMENTS

EP 0969323 A 1/2000

OTHER PUBLICATIONS

Psaltis, D. et al., "Holographic Memories," *Scientific American* (1995) p. 70–75.

Lundquist, P.M. et al., "Holographic Digital Data Storage in a Photorefractive Polymer", *Optics Letters*, vol. 21, No. 12, pp 890–892 (1996).

Zhao, C. et al., "Shrinkage-corrected volume holograms based on photopolymeric phase media for surface-normal optical interconnect", *Applied Physics Letters*, vol. 71, No. 11, pp. 1464–1466 (1997).

Anonymous: "Correction of Astigmatism for Off Axis Reconstruction Beam Holographic Deflector", *IBM Technical Disclosure Bulletin*, vol. 23, No. 9, pp 4255–4256 (1981).

\* cited by examiner

*Primary Examiner*—Jon Henry

(57) ABSTRACT

The invention involves a holographic system containing a photopolymer-type storage medium located in the system's optical path, where the medium is rotated around a first axis such that the surface of the medium is in a non-orthogonal relationship with the optical path, and a spatial light modulator also located in the optical path, where the modulator is rotated around a second axis that is substantially orthogonal to the first axis, and wherein the surface of the modulator is in a non-orthogonal relationship with the optical path. This arrangement compensates for at least a portion of aberration introduced by the photopolymer media, thereby allowing presentation of a flatter, more focused, and less distorted image at the sensor.

12 Claims, 2 Drawing Sheets

FIG. 3 *(prior art)*
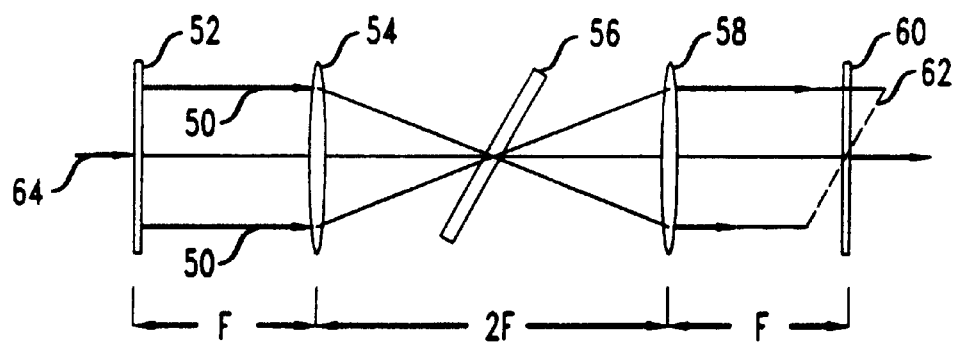
FIG. 4
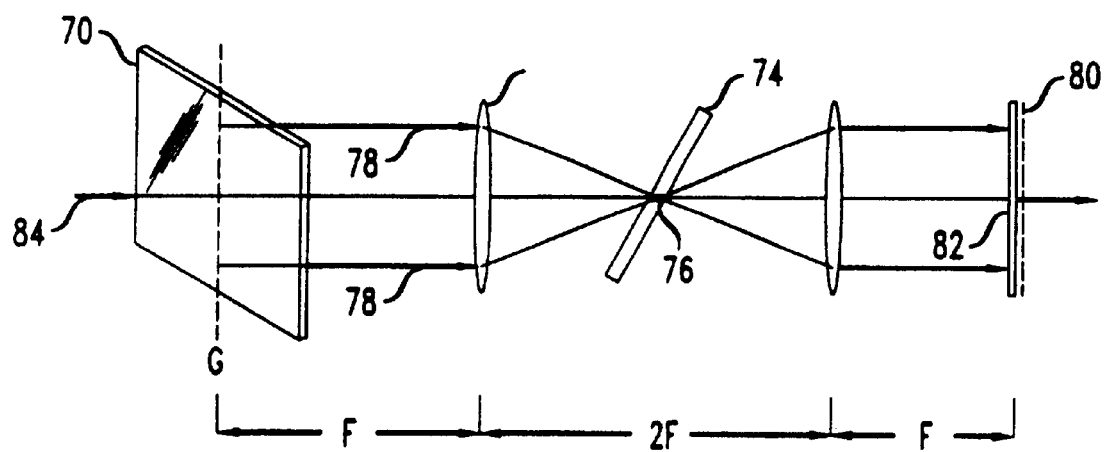

PROCESS FOR HOLOGRAPHY INVOLVING TILT COMPENSATION

BACKGROUND OF THE INVENTION

1. Field of the Invention

The invention relates to page-wise storage systems, in particular holographic storage systems.

2. Discussion of the Related Art

Developers of information storage devices and methods continue to seek increased storage capacity. As part of this development, page-wise memory systems, in particular holographic systems, have been suggested as alternatives to conventional memory devices. Holographic systems typically involve the storage and readout of entire pages of information, these pages consisting of arrayed patterns representing information. In general, a holographic system stores, in three dimensions, holographic representations of the pages as patterns of varying refractive index and/or absorption imprinted into a storage medium. Holographic systems are discussed generally in D. Psaltis et al., "Holographic Memories," *Scientific American*, November 1995.

Holographic systems are characterized by their potential for both high density storage potential and high retrieval speed. In fact, because information is typically manipulated, i.e., stored and retrieved, on a page-by-page basis, the speed of storage and retrieval compares favorably to conventional magnetic disk or compact disk storage systems. A significant advantage of holographic systems, however, is storage capacity. It is possible for each page stored as a holographic image to contain thousands or even millions of elements. Theoretically, it is believed that at the present time, up to $10^{14}$ bits of information are storable in approximately 1.0 cm$^3$ of holographic storage medium.

FIG. 1 illustrates the basic components of a holographic system 10. System 10 contains a spatial light modulator (SLM) 12, a photorecording medium 14, and a sensor 16. The SLM 12 is any device capable of optically representing data in two-dimensions. The SLM 12 is generally attached to an encoding unit which encodes data onto the modulator. Based on the encoding, the SLM 12 selectively passes or blocks portions of a beam passing through it or reflecting off of it. In this manner, the beam 20 is encoded with a data image. The image is stored by interfering the encoded signal beam 20 with a reference beam 22 at a location on or within photorecording medium 14. The interference creates an interference pattern (or hologram) that is captured within medium 14 as a pattern of, for example, varying refractive index. It is possible for more than one holographic image to be stored at a single location, or for holograms to be stored in overlapping positions, by, for example, varying the angle, the wavelength, or the phase of the reference beam 22 (generally referred to as angle, wavelength, and phase correlation multiplexing, respectively). Signal beam 20 typically passes through lens 30 before being intersected with reference beam 22 in the medium 14. It is possible for reference beam 22 to pass through lens 32 before this intersection.

Once data is stored in medium 14, it is possible to retrieve the data by intersecting reference beam 22 with medium 14 at the same location and at the same angle, wavelength, or phase at which reference beam 22 was directed during storage of the data. The reconstructed data passes through lens 34 and is detected by sensor 16. Sensor 16 is, for example, a charged coupled device or an active pixel sensor. Sensor 16 typically is attached to a unit that decodes the data.

Unfortunately, while page-wise storage and readout in a holographic system offers the potential for high speed and capacity, the page-wise nature of the system also introduces potential problems. For example, each pixel generated by the SLM 12 has a corresponding target pixel on the sensor 16, i.e., the system is designed such that each pixel stored in the medium by directing the signal beam through the SLM will, upon readout, be directed to a particular, corresponding pixel on the sensor. If, at any point in the system, the page of information is offset by a single pixel or the image becomes blurred or distorted, the stored information will be unreadable. Introduction of non-imaging elements into the system, e.g., storage media, tend to induce aberrations in the relayed image, thereby contributing to this problem. In particular, while putting the medium at an angle to the signal beam is generally desirable for photopolymer media and for some multiplexing geometries, such a configuration tends to introduce even more significant aberration.

It is therefore desired to develop techniques to reduce or avoid the introduction of aberrations into holographic systems, particular aberration introduced by non-imaging elements such as storage media.

SUMMARY OF THE INVENTION

The invention provides a process and apparatus for holography in which aberrations introduced by storage media, particularly photopolymer-type media, are substantially reduced. Specifically, as reflected in FIG. 3, photopolymer-type media 56 are generally placed at an angle to the optical path 64 in a holographic system, in order to reduce the effects of writing-induced shrinkage. This angular placement, however, introduces aberrations into the relayed image of the system, including astigmatic aberration, i.e., a tilt in the plane of focus 62. This tilt causes the page of data to match up poorly to the plane of the sensor 60, thereby affecting the accuracy of read-out.

It has been discovered, however, that it is possible to compensate for at least a portion of such aberration by introducing an orthogonal tilt in the spatial light modulator, as shown in FIG. 4. The rotation of the SLM 70 creates a similar aberration in the plane orthogonal to the plane tilted by the medium, and thereby makes the data page come into a sharper focus over the entire page. This effect allows presentation of a flatter, more focused, and less distorted image 80 at the sensor 82, and leads to better matching of each encoded pixel to its target pixel.

The invention therefore involves a holographic system containing (a) a storage medium (74) located in the system's optical path (84), where the medium is rotated around a first axis (76) such that the surface of the medium is in a non-orthogonal relationship with the optical path, and (b) a spatial light modulator (70) also located in the optical path, where the modulator is rotated around a second axis (72) that is substantially orthogonal to the first axis, and wherein the surface of the modulator is in a non-orthogonal relationship with the optical path. (Optical path indicates a path from the spatial light modulator through the medium and onto the sensor, and is also referred to in the art as the central ray.) The invention is particularly useful for 4F imaging systems.

BRIEF DESCRIPTION OF THE DRAWINGS

FIG. 3 shows the aberration introduced by angular placement of a storage medium.

FIG. 4 shows copensation of the aberration introduced by angular placement of a storage medium, according to an embodiment of the invention.

DETAILED DESCRIPTION OF THE INVENTION

Figure 1:
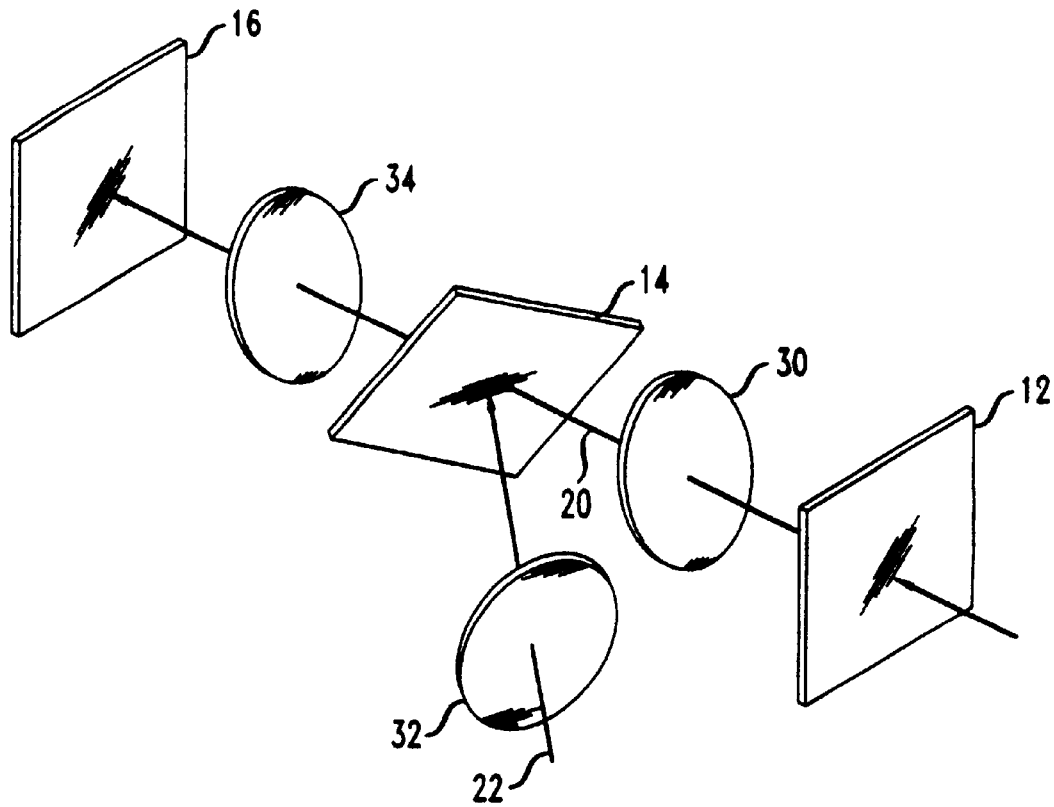
FIG. 1 shows the basis elements of a holographic system.
Figure 2:
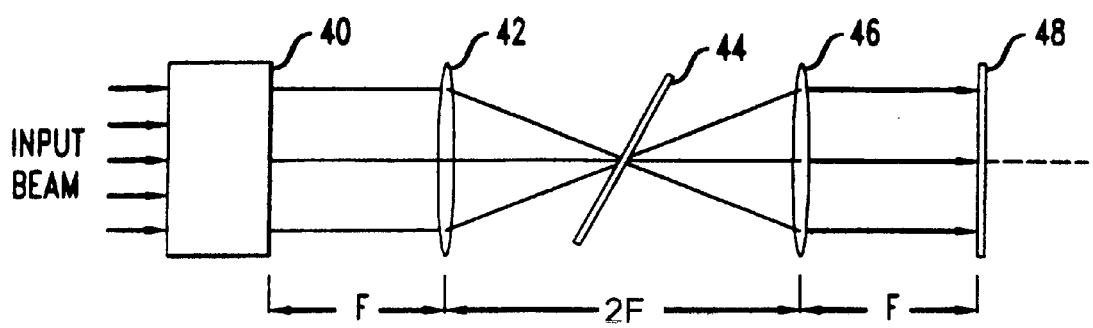
FIG. 2 shows a typical 4F holographic system.

FIG. 2 shows a typical 4F holographic storage system. The system contains a spatial light modulator (SLM) 40, a first lens 42 having a focal length F, a photopolymer-type medium 44, a second lens 46 having the same focal length F, and a sensor 48. The medium 44 is located approximately one focal length from each of the first and second lenses 42, 46, which are themselves located two focal lengths (2F) apart. Similarly, the SLM 40 is located one focal length (1F) from the first lens 42, and the sensor 48 is located one focal length (1F) from the second lens. In some cases, it is possible for the media to be positioned several millimeters away from the Fourier transform plane of the system. Also, it is possible for the SLM 40 to be illuminated by a non-plane wave beam (i.e., a beam that is converging or diverging), which will tend to move the optical Fourier transform plane from the middle of the lenses 42, 46.

As discussed above, data is stored by directing a beam through or off of the SLM 40, thereby encoding the signal beam with data, and intersecting the encoded signal beam with a reference beam in the medium 44, thereby forming the hologram. Readout is performed by directing the reference beam through the stored hologram, under the same conditions used for storage, and onto the sensor 48, where the data is decoded.

The accuracy with which such a 4F system is able to store and readout data is generally measured by performing a so-called straight-through experiment. In such an experiment, shown by the 4F system of FIG. 3, a storage beam 50 is directed along the optical path 64 through the SLM 52, the first lens 54, the medium 56, and the second lens 58, onto the sensor 60. The pixel-to-pixel correspondence between the data represented on the SLM 52 and the data presented to the sensor 60, e.g., the raw bit error rate (BER), is then measured, to determine the aberrations present in the system. As shown in FIG. 3, the tilted medium 56 causes the plane of focus 62 of the data from the SLM 52 to be tilted. Because the data's plane of focus 62 therefore does not match up well to the plane of the sensor 60, the accuracy of the readout is detrimentally affected, e.g., the BER increases.

In one embodiment of the invention, reflected in the 4F system of FIG. 4, the SLM 70 is rotated around an axis 72 orthogonal to the axis 76 (which is orthogonal to the Figure) around which the medium 74 is rotated. For example, in the system shown in FIG. 4, where the medium 74 is rotated around a horizontal axis 76, the SLM 70 is rotated around a vertical axis 72. The tilt of the SLM 70 introduces aberration similar to that introduced by the tilted medium 74, but in an orthogonal plane. Upon directing a beam 78 along the optical path, the data page comes into a sharper focus over the entire page. It is thereby possible to present a flatter, more focused, and less distorted image 80 at the sensor 82, generally without the need to change the plane in which the sensor 82 is located.

In general terms, therefore, the invention involves a system having a storage medium that is located in the optical path and rotated around a first axis, e.g., the horizontal axis 76 of FIG. 4. The rotation is such that the surface of the medium is moved into a non-orthogonal relationship with the optical path, e.g., as is typically required for photopolymer media. The invention further involves a spatial light modulator also located in the optical path. The modulator is rotated around a second axis that is substantially orthogonal to the first axis, and the surface of the modulator is in a non-orthogonal relationship with the optical path. A system in which these parameters are met is expected to benefit from the advantages of the invention, e.g., an improved image at the sensor.

The SLM rotation (from a position orthogonal to the optical path) is typically greater than 0.10° up to about 10°, more typically about 1° to about 5°. The extent of rotation depends on, among other things, the rotation of the medium, the thickness and index of refraction of the medium, the wavelength of the laser being used, the pixel size, and the focal length of the lenses in the 4F imaging system. For example, the further the medium is rotated away from a position orthogonal to the optical path, the more the SLM is generally rotated; increased thickness and refractive index of the medium generally requires more SLM rotation; a smaller wavelength generally requires more SLM rotation; and smaller pixel sizes as well as longer focal lengths tend to increase the sensitivity of the overall system, and thereby create a smaller allowable range for SLM rotation. The actual amount of SLM rotation that provides an image substantially matched to the plane of the sensor is generally determined experimentally.

It is possible to use the technique and apparatus of the invention with a variety of holographic storage methods, including angle, wavelength, peristrophic, aperture, shift, or phase multiplexing. See, e.g., U.S. Pat. No. 5,892,601 for a discussion of aperture multiplexing, and U.S. Pat. No. 5,719,691 for a discussion of phase correlation multiplexing.

It is possible to use any suitable storage media in the invention. As noted above, the invention is particular applicable to photopolymer-type media, a variety of which are known to those skilled in the art. See, e.g., co-assigned U.S. Pat. Nos. 5,874,187, 6,322,932 and 6,103,454.

The invention will be further clarified by the following example, which is intended to be exemplary.

EXAMPLE

A 4F holographic system was provided with an Epson 800×600 pixel SLM, two 45 mm focal length lenses, a photopolymer media, and a CCD detector with a 24 $\mu$m pixel size. The media was formed from two approximately 1 mm thick glass plates sandwiching about 0.75 mm of the photopolymer, and the refractive index for both the glass and the material was about 1.5. The magnification in the system was made as good as possible by use of a third ($z_1$, $z_2$) imaging lens. The medium was rotated on a spindle such that the central ray (or optical path) was 35° off the media's normal surface. The laser was a frequency-doubled YAG laser emitting at a wavelength of 532 nm.

The system was first aligned with no tilt in the SLM, i.e., the plane of the SLM was orthogonal to the optical path, as reflected in FIG. 3. A beam was directed through the SLM, lenses, and medium, and onto the detector. A few hundred errors out of 480,000 were noted.

The SLM was then rotated at angles ranging from about 1° to about 5° around an axis parallel to the axis about which the medium was rotated. The number of errors out of 480,000 ranged from about 3000 to about 4000.

The SLM was then rotated at angles ranging from about 1° to about 5° around an axis orthogonal to the axis around which the medium was rotated (and such that the surface of the modulator is in a non-orthogonal relationship with the optical path), as reflected in FIG. 4. The number of errors out of 480,000 ranged from 0 to less than 5, indicating that a raw bit error rate of $10^{-6}$ or less is possible.

Other embodiments of the invention will be apparent to those skilled in the art from consideration of the specification and practice of the invention disclosed herein.

What is claimed is:

1. A holographic system, comprising:
   a. a laser having its output directed along an optical path,
   b. a storage medium, wherein the medium is located in the optical path, and wherein the medium is rotated around a first axis such that the surface of the medium is in a non-orthogonal relationship with the optical path; and
   c. a spatial light modulator, wherein the modulator is located in the optical path, wherein the modulator is rotated around a second axis that is substantially orthogonal to the first axis, and wherein the surface of the modulator is in a non-orthogonal relationship with the optical path.

2. The holographic system of claim 1, wherein the system comprises a 4F imaging system.

3. The holographic system of claim 2, further comprising a sensor, wherein a raw bit error rate of $10^{-6}$ or less is exhibited upon directing a light beam at the spatial light modulator, through the medium, and onto the sensor.

4. The holographic system of claim 1, wherein the modulator is rotated greater than 0.1° to about 10° from a position orthogonal to the optical path.

5. The holographic system of claim 4, wherein the rotation is about 1° to about 5°.

6. The holographic system of claim 1, wherein the storage medium is a photopolymer-type medium.

7. A process for holography, comprising the steps of:
   a. providing a holographic system comprising a laser having its output defining an optical path, a storage medium, a spatial light modulator, and a detector, wherein the storage medium, the spatial light modulator, and the detector are located in the optical path of the laser;
   b. providing the medium with a rotation around a first axis such that the surface of the medium is in a non-orthogonal relationship with the optical path;
   c. providing the spatial light modulator with a rotation around a second axis that is substantially orthogonal to the first axis such that the surface of the modulator is in a non-orthogonal relationship with the optical path; and
   d. directing the output of the laser at the spatial light modulator.

8. The process of claim 7, wherein the system comprises a 4F imaging system 9.

9. The process of claim 8, wherein a raw bit error rate of $10^{-6}$ or less is exhibited upon directing the light beam at the spatial light modulator, through the medium, and onto the sensor.

10. The process of claim 7, wherein the modulator is rotated greater than 0.1° to about 10° from a position orthogonal to the optical path.

11. The process of claim 10, wherein the rotation is about 1° to about 5°.

12. The process of claim 7, wherein the storage medium is a photopolymer-type medium.

* * * * *